US005959338A

United States Patent [19]

Youngner et al.

[11] Patent Number: 5,959,338

[45] Date of Patent: Sep. 28, 1999

[54] MICRO ELECTRO-MECHANICAL SYSTEMS RELAY

[75] Inventors: Daniel W. Youngner, Maple Grove; Burgess R. Johnson, Bloomington, both of Minn.

[73] Assignee: Honeywell Inc., Minneapolis, Mich.

[21] Appl. No.: 08/999,420

[22] Filed: Dec. 29, 1997

[51] Int. Cl.[6] .................... H01L 29/82

[52] U.S. Cl. .................... 257/419; 257/415

[58] Field of Search .................... 257/419, 415; 338/42

[56] References Cited

U.S. PATENT DOCUMENTS

| | | |
|---|---|---|
| 4,222,277 | 9/1980 | Kurtz et al. . |
| 4,287,501 | 9/1981 | Teminaga et al. . |
| 5,082,242 | 1/1992 | Ohnstein . |
| 5,176,358 | 1/1993 | Ohnstein . |
| 5,180,623 | 1/1993 | Ohnstein . |
| 5,216,273 | 6/1993 | Doering et al. . |
| 5,244,537 | 9/1993 | Ohnstein . |
| 5,323,999 | 6/1994 | Ohnstein . |
| 5,441,597 | 8/1995 | Ohnstein . |

FOREIGN PATENT DOCUMENTS

| | | |
|---|---|---|
| 286258 | 10/1995 | Japan . |

OTHER PUBLICATIONS

Cabuz, "Tradeoffs in MEMS Materials", SPIE vol. 2881, p. 160 (Oct. 1996).

Shikida, Sato Characteristics of an Electrostatically–Driven Gas Valve under High Pressure Conditions.

Shikida,Sato,Harada, "Fabrication of an S–Shaped Microactuator," Journal of Microelectromechanical Systems, vol. 6, No. 1 (Mar. 1997).

Shikida,Sato,Tanaka,Kawamura,Fujisaki "Electrostatically–Actuated Gas Valve with large Conductance", 7$^{th}$Intl. Conf. On Solid–State Sensors and Actuators, J. Microelectromech. Syst. vol. 3, No. 2, (Jun. 1994).

B.Halg, "On a Nonvolatile Memory Cell Based on Micro–Electro–Mechanics," Proceedings of MEMS CH2832–4/90/0000–0172 IEEE (1990).

Srinivasan et al., "Self–Assembled fluorocarbon Films for Enhanced Stiction Reduction" (1997).

Deng, Mehregany,Sukenik, "Performance Impact of Monolayer Coating of Polysilicon Micromotors," 0–7803–2503–6 IEEE (1995).

Maboudian and Howe, "Critical Review: Adhesion in Surface Micromechanical Structures," J. Vac.Sci.Technol. B 15(1) (Jan./Feb. 1997).

(List continued on next page.)

*Primary Examiner*—Stephen D. Meier

*Attorney, Agent, or Firm*—John G. SHudy, Jr.; Roland W. Norris

[57] ABSTRACT

A relay device build using MEMS technology and having a semiconductor wafer base with a surface depression having a first electrically conductive surface pattern. A lower diaphragm is moveably positioned above the depression for contact and has a second electrically conductive surface pattern thereon. An upper diaphragm is positioned above the lower diaphragm, with a central electrode mounted between them to selectively attract and move a diaphragm upon application of voltage. A post connects the upper and lower diaphragms to move a diaphragm when the other is moved electrostatically. The diaphragms define a sealed region enclosing the central electrode. The surface patterns may be tapered at their perimiters to provide a contact contour allowing gradually increasing contact as the diaphragm moves toward the surface. The preferred wafer is a silicon wafer, and the diaphragms are polysilicon. The patterns are formed from highly conductive material like gold, while the outer regions are a high resistive, chemically stable material like CrsiN. The sealed region is evacuated to have a vacuum, or may be filed with an inert gas. In a preferrred embodiment, the sealed region is filled with a fluid having a measurable viscosity, and region is adapted to move the fluid upon electrostatic movement of the diaphragm, such that the viscosity of the fluid is selected to adjust the rate of movement of the diaphragm.

28 Claims, 2 Drawing Sheets

OTHER PUBLICATIONS

Houston,Maboudian,Howe "Assembled Monolayer Films as Durable Anti–Stiction Coatings for Polysilicon Microstructures," Solid–State Sensor and Actuator Workshop (Jun. 2–6, 1996).

Alley,Cuan,Howe,Komvopoulos, "The Effect of Release–Etch Processing on Surface Microstructure Stiction," 0–7803–0456–X/92 IEEE (1992).

Man,Gogoi,Mastrangelo, "Elimination of Post–Release Adhesion in Microstructures using Conformal Fluorocarbon Coatings", Journal of Microelectromechanical systems, vol. 6, No. 1 (Mar. 1997).

Gogoi,Mastrangelo, "Adhesion Release and Yield Enhancement of Microstructures Using Pulsed Lorentz Forces," Journal of Microelectromechanical Systems, vol. 4, No. 4 (Dec. 1995).

Deng, Collins, Mehregany, Sukenik, "Performance Impact of Monolayer Coatingof Polysilicon Micromotors" (1995).

Elders, Jansen, Elwenspoek , "Materials Analysis of Fluorocarbon Films for MEMS Applications" (Date unknown).

Tas, Sonnenberg,Jansen,Legtenberg,Elwenspoek, "Stiction in surface micromaching," J.Micromech. Microeng. 6 (1996).

Robertson, Wise "An Electrostatically–Actuated Microvalve for Semiconductor Gas Flow Control", Solid–State Sensor and Actuator Workshop (Jun. 2–6, 1996).

Ohnstein,Fukiura,Ridley,Bonne "Micromachined Silicon Microvalve", Proceedings of MEMS, IEEE Microelectro Mechanical Systems, Napa Valley,CA. (Feb. 11–14, 1990).

Toshiyoshi,Fujita, "Electrostatic Micro Torsion Mirrors for an Optical Switch Matrix", Journal of Microelectromechanical Systems, vol. 5, No. 4 (Dec. 1996).

Scheeper, Voorthuyaen, Olthuis,Bergveld, "Investigation of attractive forces between PECVD silicon nitride microstructure and an oxidized silicon substrate", Sensor and Actuators A, 30 (1992).

Lee, Hamilton, Trevino, "Low Power, tight Seal, Polyimide Electrostatic Valve," DSC–vol. 59, Microelectromechanical Systems (MEMS) ASME 1996.

DeBoer et al., "Measuring and Modeling Electrostatic Adhesion in Micromachines," Transducer '97 (Jun. 16–20, 1997).

Bertz,Schubert,Werner, "Silicon Grooves with Sidewall Angles down to 1° made by Dry Etching" (Date unknown).

Bustgens,Bacher,Menz,Schomburg, "Micropump Manufactured by Thermoplastic Molding" MEMS 1994.

Wagner,Quenzer,Hoerschelmann,Lisec,Juerss, "Bistable Microvalve with Pneumatically Coupled Membrances," 0–7803–2985–6/96 IEEE (1996).

Branebjerg,Gravesen "A New Electrostatic Actuator Providing Improved Stroke Length and Force," Micro Electro Mechanical Systems (Feb. 4–7, 1992).

MICRO ELECTRO-MECHANICAL SYSTEMS RELAY

FIELD OF THE INVENTION

The present invention relates to an improved Micro Electro-Mechanical System (MEMS) relay. More particularly the invention relates to a MEMS relay having longer current decay time, increased heat dissipation, reduced stiction and hermetic sealing.

BACKGROUND OF THE INVENTION

Conventional MEMS relays have been employed for various uses, but have certain drawbacks that prevent wider acceptance and preclude use in some applications because of the inherent characteristics of these conventional design. Specifically, MEMS relays open and close rapidly, providing large amounts of power that is dumped into the contacts by the inductive pulse, which is a major problem and limits design flexibility.

Heat that is generated during operation builds up, causing localized temperature increases. These hot spots cause potential or actual damage in the relay. However, no practical way to reduce heat has yet been proposed. Another problem some relays have is stiction, where the electrodes are difficult to separate. This increases the cost and decreases the reliability of the relays, requiring alternative means for overcoming the stiction.

Often times, the electrical contacts and/or the actuating membranes in conventional designs come into contact with the environment, creating a risk of corrosion or sparking. This drastically reduces the operating life of the relay, especially in hostile environments and when switching low or non self-cleaning currents.

A major problem with conventional MEMS relays is that they are not flexible enough to permit customization of the electrical load being switched. There are not a lot of design options available.

It would be of great advantage in the art if an improved MEMS relay could be provided to give a much wider range of design options, permitting the needed customization of load switching, and enabling the creation of a family of relays to serve a wide range of customer needs.

It would be another great advance in the art if MEMS relays could be provided which reduced the amount of power dumped into the contacts by an inductive pulse.

Yet another advance would be to provide MEMS relays operable to dissipate heat, reduce stiction, and long-lived in hostile environment and when switching low or non self-cleaning currents.

Other advantages will appear hereinafter.

SUMMARY OF THE INVENTION

It has now been discovered that the above and other objects of the present invention may be accomplished in the following manner. Specifically, the present invention provides a relay device which is built using MEMS technology.

The relay is formed on a semiconductor wafer base, such as a silicon wafer. The base is provided with a surface depression or hollow region having a electrically conductive surface pattern formed thereon. A lower diaphragm is mounted above the surface depression for contact with the depression surface. The lower diaphragm has a second electrically conductive surface pattern thereon, preferably similar to that on the wafer base. An upper diaphragm with an electrode thereon is above the lower diaphragm. Between the diaphragms is a central electrode to electively attract a diaphragm electrode upon application of voltage and move the diaphragm. The preferred material for the diaphragms is polysilicon.

A mechanical connection, such as one or more posts, are connectively mounted between the diaphragms for moving one diaphragm when the other diaphragm is moved by application of voltage.

The diaphragms are sealingly mounted on the base to define a sealed region therebetween enclosing said central electrode and the diaphragm electrodes. This sealed region may be evacuated to vacuum or it may be filled with a gas or a fluid having a measurable viscosity. In this latter embodiment, the region is adapted to move the fluid upon electrostatic movement of the diaphragm, such that the viscosity of the fluid is selected to adjust the rate of movement of diaphragms.

An important part of the present invention is having the base surface pattern and said lower diaphragm pattern tapered at their respective perimiters to provide a contact contour. Initial contact occurs only at the periphery of the depression and increasing contact is achieved as the lower diaphragm moves toward the surface to finally provide full contact between the patterns over a predetermined period of time.

It is important that the central regions of the patterns be formed from highly conductive material such as gold or any other such conductive material. Similarly, the patterns include outer regions extending from the center formed from high resistive, chemically stable materials such as CrSiN.

The flexibility of the diaphragms and the gap at the perimeter of the diaphragms is preferably adjusted to require a voltage of ten volts to move said diaphragms electrostatically. The patterns may be shaped to provide a conductive center with decreasing spoke-like regions extending from the center. Alternatively, the patterns may be spiral or other shapes, depending upon specific needs of the system.

DESCRIPTION OF THE DRAWINGS

For a more complete understanding of the invention, reference is hereby made to the drawings, in which.

DETAILED DESCRIPTION OF THE PREFERRED EMBODIMENT

Figure 1:
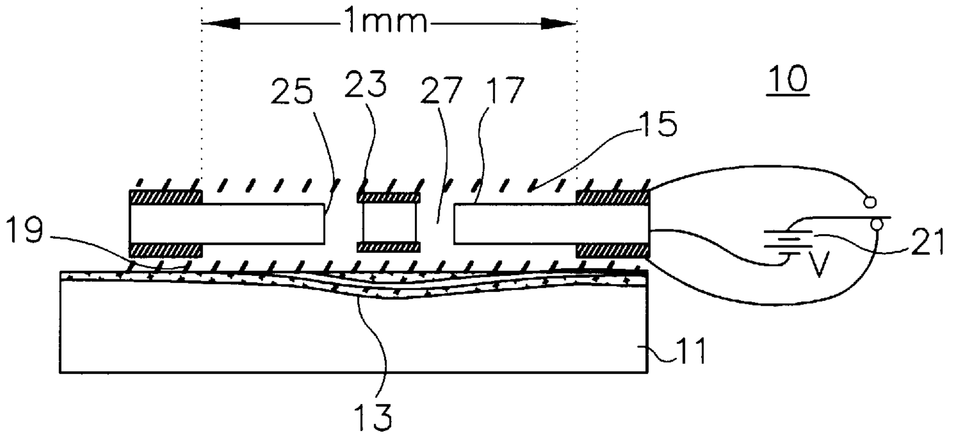
FIG. 1 is a schematic, sectional view of the preferred embodiment of this invention.

The MEMS relay shown generally at 10 in FIG. 1 is constructed in accordance with the present invention. A substrate 11, usually a silicon wafer although other semiconductor base materials are suitable as well, is formed with a depression 13, more fully described below, which has a conductive pattern placed thereon. The relay is mounted on the substrate and comprises an upper conductive polysilicon diaphragm 15, a central electrode 17 and a lower conductive polysilicon diaphragm 19, along with a voltage source 21 for applying a voltage differential between the central electrode 17 and one or the other of the diaphragms 15 and 19 to generate an electrostatic force therebetween.

As a voltage is applied between the upper diaphragm 15 and the central electrode 17, electrostatic forces pull the diaphragm downward. The stiffness of the diaphragms, along with the gap and taper at the perimeter of the diaphragm are adjusted so that actuation occurs at about ten volts. The lower diaphragm 19, which is connected by post 23 through a hole 25 in central electrode 17 to upper diaphragm 15, is pushed downward so that the bottom diaphragm 19 makes contact on the depression 13 in base 11. The depression 13 is tapered and contoured so that lower diaphragm 19 initially makes contact only at the periphery of depression 13, but as actuation progresses, more and more of the central regions of the conductive portions of the depression 13 and diaphragm 19 begin making contact. Eventually, the surfaces contact one another everywhere.

If voltage is then applied between the lower diaphragm 19 and the central electrode 17, electrostatic forces reverse the action. Lower diaphragm 19 begins separating from the base depression 13 at it's center and continues to separate until contact is made only at the periphery. Finally, again, there is no contact between the two surfaces at all.

The diaphragms may be prestressed, so that the relay is normally open, normally closed, or neutral, as shown in FIG. 1. The region 27 between diaphragms 15 and 19 may be evacuated or filled with either an inert gas (such as argon) or a somewhat viscous fluid. The use of a viscous fluid allows control over the rate of diaphragm opening or closing because of the finite time it takes viscous fluid to flow between the two sides of the central electrode, as the device moves under electrostatic forces. For example, it may require 0.1 milliseconds to fully open and close the relay. Chambers or slits would be used to provide a place for the gas or liquid to move as the device operates.

Figure 2A:
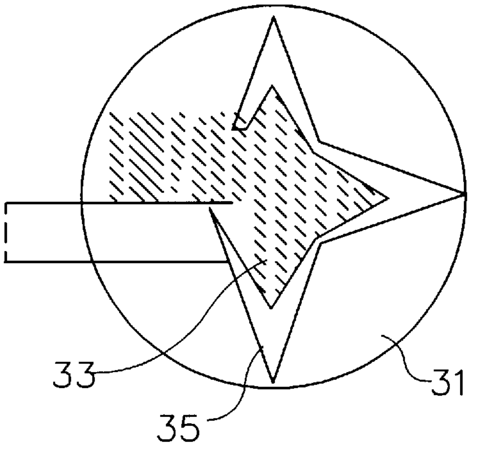
FIGS. 2*a* and 2*b* are schematic plan view illustrating one embodiment.
Figure 2B:
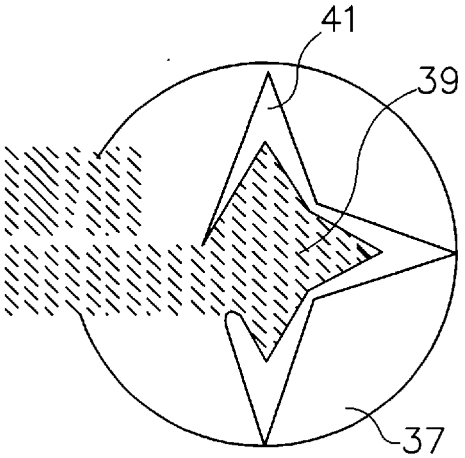
Figure 3A:
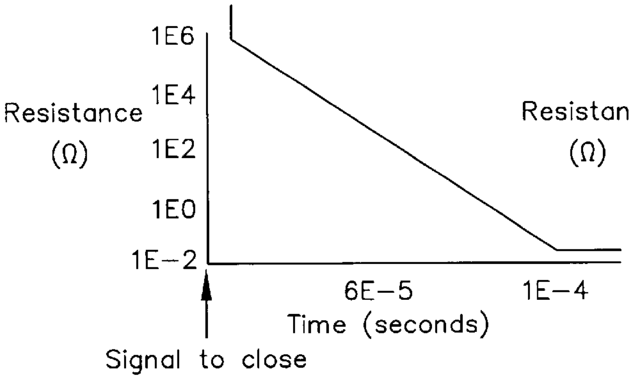
FIG. 3 is a graphical representation of the device of this invention using the embodiment of FIG. 2.
Figure 3B:
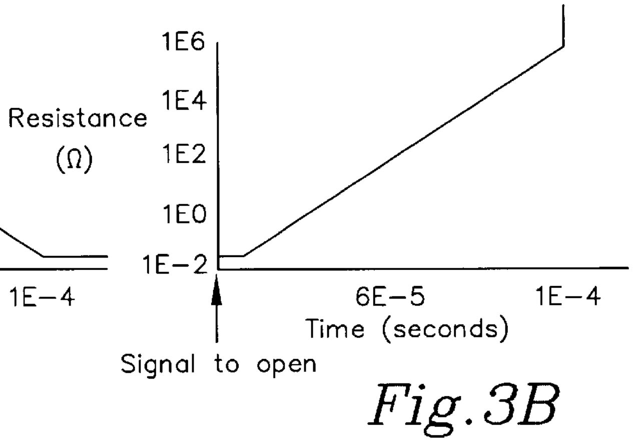

An important part of the present invention is the use of conductive patterns on the bottom of the lower diaphragm 19 and the top of depression 13 in base 11. FIG. 2 illustrates a preferred embodiment in which the top surface 31 on the bottom of diaphragm 19 has a central conductive region 33, for example of 2$\mu$ thick gold and an outer contact surface 35, of CrSiN or other highly resistive, chemically stable materials. Similarly, bottom surface 37 of the top of depression 13 has a central conductive region 39, again for example of 2$\mu$ thick gold and an outer contact surface 41, also of CrSiN or other highly resistive, chemically stable materials. When the diaphragms are pulled downward, the resistance between surfaces 33 and 39 changes over time by several orders of magnitude, as shown schematically in FIG. 3*a*. When actuation is reversed and the contacts 33 and 39 are separated, the resistance increases gradually, as shown in FIG. 3*b*.

Figure 4:
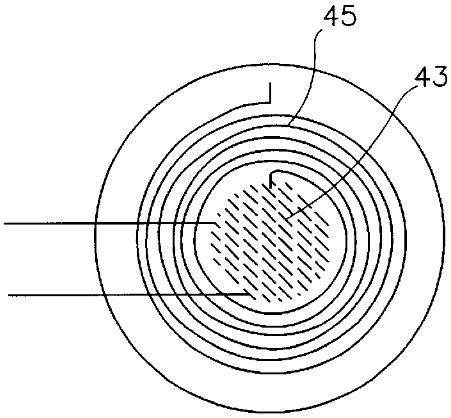
FIG. 4 is a schematic plan view illustrating an alternative embodiment.
Figure 5:
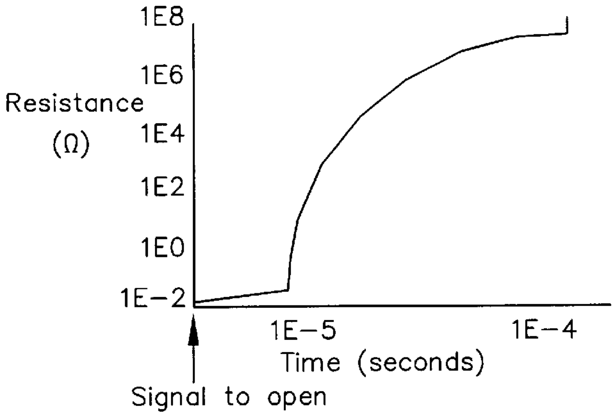
FIG. 5 is a graphical representation of the device of this invention using the embodiment of FIG. 4.

Clearly, patterns 33 and 35, along with patterns 39 and 41, may be customized, using variations on conductive alloys and shapes, to govern the dynamics of how the diaphragms 15 and 19 open and close to provide a very wide variety of electrical switching behavior. FIG. 4 illustrates an alternative embodiment in which a gold, conductive central region 43 and resistive CrSiN region 45 provide a different response, shown as a nonlinear response in FIG. 5. The variations are virtually unlimited, as long as contact between the lower diaphragm and the depression changes over time by several orders of magnitude, as set forth hereinabove.

The gap and taper between the lower diaphragm 19 and the depression 13 in substrate 11 may also be selected so the diaphragm will not close even when the voltage across the contacts is as high as 150 volts. The patterns above, star shaped in FIG. 2 and spiral in FIG. 4, as examples, assure that as the diaphragm and substrate separate, a very small area will be available for pull-in; hence the pull-in force will be very small. There will be neither pull-in nor AC chatter.

The present invention is built using MEMS technology, and may be used in MEMS switches, accelerometers, blood analysis kits, optical systems and relays. It is further intended that the present invention be used in conventional systems (not micros like microwave ovens and in automobiles and the like.

While particular embodiments of the present invention have been illustrated and described, it is not intended to limit the invention, except as defined by the following claims.

We claim:

1. A relay device, comprising:

a semiconductor wafer base, said base having a surface depression having a first electrically conductive surface pattern formed thereon;

a lower diaphragm positioned above said surface depression and moveable for contact therewith, said lower diaphragm having a second electrically conductive surface pattern thereon;

an upper diaphragm positioned above said lower diaphragm, said upper diaphragm having an electrode thereon;

a central electrode mounted between said upper and lower diaphragm, said central electrode being positioned to selectively attract said upper diaphragm electrode upon application of voltage therebetween and to move said upper diaphragm to a lower position, said central electrode further being positioned to selectively attract said lower diaphragm electrode upon application of voltage therebetween and to move said lower diaphragm to an upper position; and mechanical connection means connectively mounted between said upper diaphragm and said lower diaphragm for moving one of said diaphragms mechanically when the other of said diaphragms is moved by said application of voltage to said central electrode and said other diaphragm;

said upper and lower diaphragms being sealingly mounted on said base to define a sealed region therebetween enclosing said central electrode and said diaphragm electrodes;

said base surface pattern and said lower diaphragm pattern being tapered at their respective perimiters to provide a contact contour allowing initial contact only at the periphery of the depression and increasing contact as said lower diaphragm moves toward said surface to provide full contact between said patterns over a predetermined period of time.

2. The device of claim 1, wherein wherein said wafer is a silicon wafer.

3. The device of claim 1, wherein wherein said diaphragms are formed from polysilicon.

4. The device of claim 1, wherein said first and second patterns include central regions formed from highly conductive material.

5. The device of claim 4, wherein said highly conductive material is selected from gold.

6. The device of claim 1, wherein said first and second patterns include outer regions extending from said central region and are formed from high resistive, chemically stable material.

7. The device of claim 6, wherein wherein said high resistive, chemically stable material is CrsiN.

8. The device of claim 1, wherein each of said diaphragms and the gap at the perimeter of said diaphragms is adjusted to require a voltage of ten volts to move said diaphragms electrostatically.

9. The device of claim 1, wherein said sealed region is evacuated to have a vacuum.

10. The device of claim 1, wherein said sealed region is filed with an inert gas.

11. The device of claim 1, wherein said sealed region is filed with a fluid having a measurable viscosity, and region is adapted to move said fluid upon electrostatic movement of said diaphragm, such that the viscosity of said fluid is selected to adjust the rate of movement of said diaphragm.

12. The device of claim 1, wherein said patterns are substantially identical.

13. The device of claim 12, wherein said patterns are shaped to provide a more conductive center and decreasing spoke-like regions extending from said center.

14. The device of claim 1, wherein said patterns are spiral.

15. In a relay device, said device having a semiconductor wafer base and a pair of diaphragms centered about a central electrode for movement of said diaphragms upon application of a voltage between said central electrode and one of said diaphragms, the improvement comprising:

a surface depression having a first electrically conductive surface pattern formed on the surface of said base;

a second electrically conductive surface pattern on said lower diaphragm; and mechanical connection means connectively mounted between said upper diaphragm and said lower diaphragm for moving one of said diaphragms mechanically when the other of said diaphragms is moved by said application of voltage to said central electrode and said other diaphragm;

said upper and lower diaphragms being sealingly mounted on said base to define a sealed region therebetween enclosing said central electrode and said diaphragm electrodes;

said base surface pattern and said lower diaphragm pattern being tapered at their respective perimiters to provide a contact contour allowing initial contact only at the periphery of the depression and increasing contact as said lower diaphragm moves toward said surface to provide full contact between said patterns over a predetermined period of time.

16. The device of claim 15, wherein wherein said wafer is a silicon wafer.

17. The device of claim 15, wherein wherein said diaphragms are formed from polysilicon.

18. The device of claim 15, wherein wherein said first and second patterns include central regions formed from highly conductive material.

19. The device of claim 18, wherein said highly conductive material is selected from gold.

20. The device of claim 15, wherein said first and second patterns include outer regions extending from said central region and are formed from high resistive, chemically stable material.

21. The device of claim 20, wherein wherein said high resistive, chemically stable material is CrsiN.

22. The device of claim 15, wherein each of said diaphragms and the gap at the perimeter of said diaphragms is adjusted to require a voltage of ten volts to move said diaphragms electrostatically.

23. The device of claim 15, wherein said sealed region is evacuated to have a vacuum.

24. The device of claim 15, wherein said sealed region is filed with an inert gas.

25. The device of claim 15, wherein said sealed region is filled with a fluid having a measurable viscosity, and region is adapted to move said fluid upon electrostatic movement of said diaphragm, such that the viscosity of said fluid is selected to adjust the rate of movement of said diaphragm.

26. The device of claim 15, wherein said patterns are substantially identical.

27. The device of claim 15, wherein said patterns are shaped to provide a more conductive center and decreasing spoke-like regions extending from said center.

28. The device of claim 15, wherein said patterns are spiral.

* * * * *